US006420707B1

(12) United States Patent
Anthony et al.

(10) Patent No.: US 6,420,707 B1
(45) Date of Patent: Jul. 16, 2002

(54) INFRA-RED DETECTOR

(75) Inventors: Carl J. Anthony; Kevin M. Brunson; Charles T. Elliott; Neil T. Gordon; Timothy J. Phillips; Michael J. Uren, all of Malvern (GB)

(73) Assignee: Qinetiq Limited, London (GB)

( * ) Notice: Subject to any disclaimer, the term of this patent is extended or adjusted under 35 U.S.C. 154(b) by 0 days.

(21) Appl. No.: 09/297,176
(22) PCT Filed: Nov. 6, 1997
(86) PCT No.: PCT/GB97/03053
§ 371 (c)(1), (2), (4) Date: Jul. 21, 1999
(87) PCT Pub. No.: WO98/21757
PCT Pub. Date: May 22, 1998

(30) Foreign Application Priority Data

Nov. 14, 1996 (GB) ............................................. 9623704

(51) Int. Cl.[7] ............................................. H01L 31/113
(52) U.S. Cl. ................................................... 250/338.4
(58) Field of Search ...................................... 250/338.4

(56) References Cited

U.S. PATENT DOCUMENTS

| 4,429,330 A | * | 1/1984 | Chapman .................... 358/113 |
| 4,803,537 A | * | 2/1988 | Lewis et al. ................... 357/30 |
| 5,016,073 A | | 5/1991 | Elliott et al. |
| 5,248,884 A | | 9/1993 | Brewitt-Taylor et al. |
| 5,525,828 A | * | 6/1996 | Bassous et al. ............. 257/457 |

FOREIGN PATENT DOCUMENTS

GB 1 488 258 10/1977

OTHER PUBLICATIONS

T. Ando, "Inter–Subband Optical Absorption in Space–Charge Layers on Semiconductor Surfaces" Z. Physic B, 26, pp. 263–272 (1977).

Ryzhii V: "An Infrared Lateral Hot–Electron Phototransistor" Semiconductor Science and Technology, vol. 9, No. 7, Jul. 1, 1994, pp. 1391–1394, XP000451061 see abstract: figures 1,2 see paragraph 1 see paragraph 2.

Wheeler R G et al: "A novel voltage tuneable infrared spectrometer–detector" IEEE Transactions on Electron Devices, No. 1975, USA, vol. ED22, No. 11, ISSN 0018–9383, pp. 1001–1009, XP002054984 cited in the application see abstract; figures 1,2,14,15 see paragraph 1 see paragraph 2.

Heitmann D et al: "Grating–coupler–induced intersubband resonances in electron inversion layers of silicon" Physical Review B (Condensed Matter), Jun. 15, 1986, USA, vol. 33, No. 12, pt. 1, ISSN 0163–1829, pp. 8269–8283, XP002054985 cited in the application see abstract see paragraph 1.

* cited by examiner

Primary Examiner—Constantine Hannaher
Assistant Examiner—Otilia Gabor
(74) Attorney, Agent, or Firm—Nixon & Vanderhye P.C.

(57) ABSTRACT

An infra-red detector (10) comprises a detector region (38) and a collector region separated by a barrier region. Operation of these regions is controlled by potentials applied to respective gate electrodes (30, 34, 32), insulated from the detector, barrier and collector regions by an insulating oxide layer (36). The detector, barrier, and collector regions may be arranged on a silicon substrate (24). In operation, photo-excited electrons are generated in the detector region and these cross the barrier region for readout from the collector region.

7 Claims, 5 Drawing Sheets

INFRA-RED DETECTOR

BACKGROUND OF THE INVENTION

1. Field of the Invention

The present invention relates to infra-red detectors and more particularly but not exclusively to infra-red detectors for detecting infra-red radiation having a wavelength in the range 8–14 μm.

2. Discussion of Prior Art

A variety of infra-red detectors have been described previously. For example, United Kingdom patent No. 1 488 258 describes a thermal radiation imaging device comprising a strip of photoconductive material in which infra-red radiation from a scene is scanned onto the photoconductive strip. The photoconductive strip described therein is a strip of cadmium mercury telluride, indium antimonide or lead tin telluride. U.S. Pat. No. 5, 016, 073 describes an integrated photoconductive detector comprising a heterostructure of cadmium mercury telluride alloys.

The above referenced detectors suffer from the disadvantage that they are not readily compatible with silicon integrated circuit fabrication techniques. It would be desirable to fabricate an infra-red detector which could be easily combined with a silicon integrated circuit in order to reduce the fabrication cost and possibly also to increase the signal to noise ratio.

SUMMARY OF THE INVENTION

It is an object of the present invention to provide an alternative infra-red detector.

The present invention provides an infra-red detector comprising a detector region and a collector region with a barrier region therebetween such that in operation incident infra-red radiation of a wavelength within an operating band is capable of exciting electrons within the detector region to an excited state in which the electrons have an energy corresponding to a sub-band energy level such that said electrons are able to cross the barrier region so as to be detectable in the collector region, characterized in that said detector region, barrier region and collector region are laterally displaced with respect to one another over a surface region of a semiconductor substrate.

An infra red detector in which the active regions are laterally displaced with respect to one another over a semiconductor substrate offers potential benefits of simplifying the manufacturing process compared with previous semiconductor infra-red detectors in which the active elements are disposed successively on a substrate.

The detector of the invention may be disposed on a silicon substrate.

A voltage tunable infra-red detector was proposed by Wheeler and Goldberg in IEEE Trans. Electron Devices, ED-22 (11), 1975, page 1001 which utilised inter-sub-band absorption in a silicon MOSFET inversion layer as the detection mechanism. Inter-sub-band transitions are described by Heitmann and Mackens in Physical Review B, Volume 33 Number 12, 1986, pages 8269 to 8283. In a metal-silicon dioxide-silicon device, a potential well may be formed at the interface of the silicon and the silicon dioxide, as shown in FIG. 1. In this narrow "triangular" well, electron motion in the z-direction is quantised, with electron motion in the x-and y-directions being unaffected. The one particle energy spectrum of the electrons, $$E_i(k_x, k_y) = E_i + \frac{\hbar^2 k_x^2}{2m_x} + \frac{\hbar^2 k_y^2}{2m_y}$$

where $m_x$ and $m_y$ are the effective masses in the x-and y-directions respectively and $k_x$ and $k_y$ are the wave numbers in the x-and y-directions, consists of a set of sub-bands (index i) that arises from the quantised motion perpendicular to the interface and continuous dispersion parallel to the interface.

Electrons may be transferred to a higher sub-band by absorption of an infra-red photon at an energy equal to the inter-sub-band energy separation. This process has a relatively high probability compared with free electron absorption because in this case k can be conserved. The sub-band energy levels can be calculated, assuming a triangular potential well, using the Wentzel-Kramers-Brillouin approximation. In this simple case, the calculation gives:

$$E_i = \left(\frac{\hbar^2}{2m_z}\right)^{1/2} \left(\frac{3\pi}{2} qF_s\right)^{2/3} \left(i + \frac{3}{4}\right)^{2/3},$$

where q is the charge, $F_s$ is the electric field and $m_z$ is the effective mass perpendicular to the interface.

The operation of an inter-sub-band infra-red detector depends on having an energy separation which is approximately equal to the photon energy to be detected. The energy separation increases as the doping level of the silicon increases. For the $E_1$–$E_0$ sub-bands, it is estimated that for a surface potential equal to the silicon band gap the energy separation increases from approximately 10 meV at a dopant level of $10^{15}$ cm$^{-3}$ to 100 meV at $10^{18}$ cm$^{-3}$ for {100} silicon. The energy separations for {110} and {111} surfaces are slightly greater for the same dopant level. The separation increases as the surface potential increases, with the maximum energy separation of the 0–1 transition being limited by the breakdown field of the oxide.

The above cited paper by Heitmann and Mackens describes experimental measurements on grating devices where the evidence for inter sub-band transitions was obtained by comparing the radiation transmitted through the device when the gate was biased above the threshold voltage to that when the gate was at or below the threshold voltage. The arrangement described in this paper thus needed a separate infra-red detector for detecting the transmitted radiation. The device described is not an infra-red detector but is a device for measuring inter-sub-band transitions.

The operation of the device of the invention may be controlled by gates adjacent the regions. Potentials applied to respective gates will control the passage of electrons between the differing regions in response to received radiation.

Preferably the silicon substrate has a {111} crystallographic orientation thereby avoiding the requirement for prisms or diffraction gratings on the surface of the detector to provide a component of the electric field of the incident radiation perpendicular to the surface. If the laterally disposed detector has an interdigitated structure, the efficiency of the device may be improved.

BRIEF DESCRIPTION OF THE DRAWINGS

In order that the invention may be more fully understood, embodiments thereof will now be described by way of example only with reference to the accompanying drawings in which.

DETAILED DISCUSSION OF PREFERRED EMBODIMENTS

Figure 1:
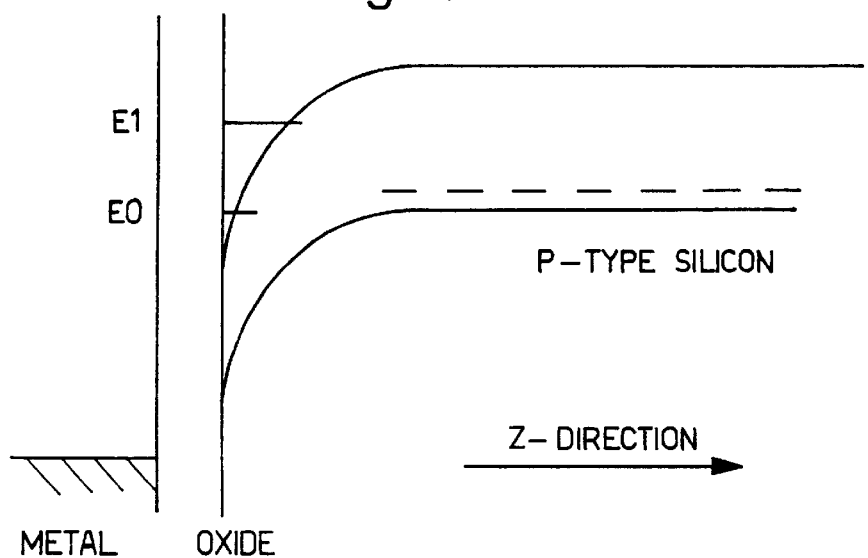
FIG. 1 is a schematic diagram of a potential energy well of a metal-oxide-silicon interface.
Figure 2:
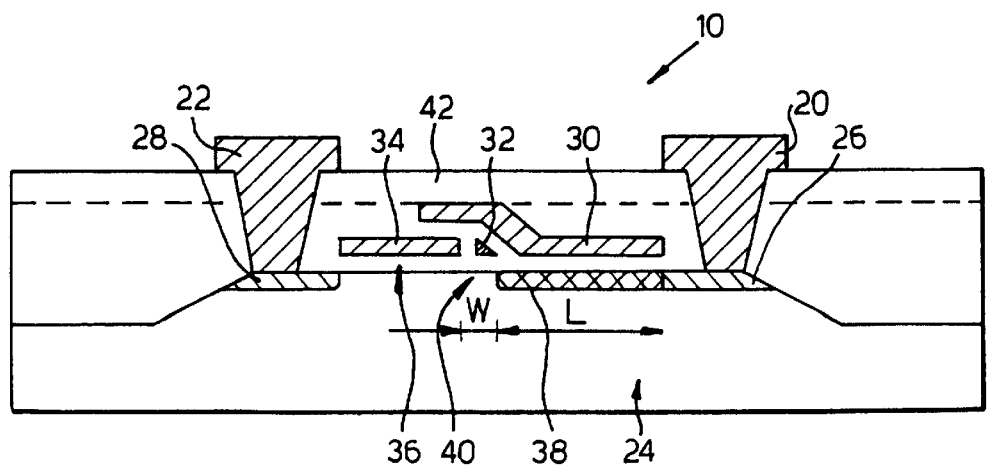
FIG. 2 is a cross-sectional view of a schematic infra-red detector of the invention.

Referring now to FIG. 2 there is shown in schematic form a cross-sectional view of an infra-red detector of the invention indicated generally by 10. The detector 10 has a source contact 20 and a drain contact 22 connected to a {111} p-type (boron doped) silicon substrate 24 by respective contact regions 26 and 28 which have n-type degenerate doping, with a dopant concentration greater than $3\times10^{18}$ $cm^{-3}$. The detector 10 has three gates: a detector gate 30, a transfer gate 32, and a collector gate 34, each of which is fabricated from a respective deposited polysilicon layer. These gates are electrically insulated from each other and the substrate 24 by an oxide region 36. The detector 10 has a detector region 38 which has a higher dopant concentration than a region 40 of the substrate 24 underneath the transfer gate 32 and the collector gate 34. A top oxide layer 42 provides a capping layer.

The detector 10 has an overall width W of approximately 6 µm. The transfer gate 32 has a width L of approximately 250 nm and is separated from the substrate 24 by the oxide region 36 which has an approximate thickness of 29 nm. The detector region 38 is doped with boron to a concentration of $5\times10^{17}$ $cm^{-3}$.

Figure 3:
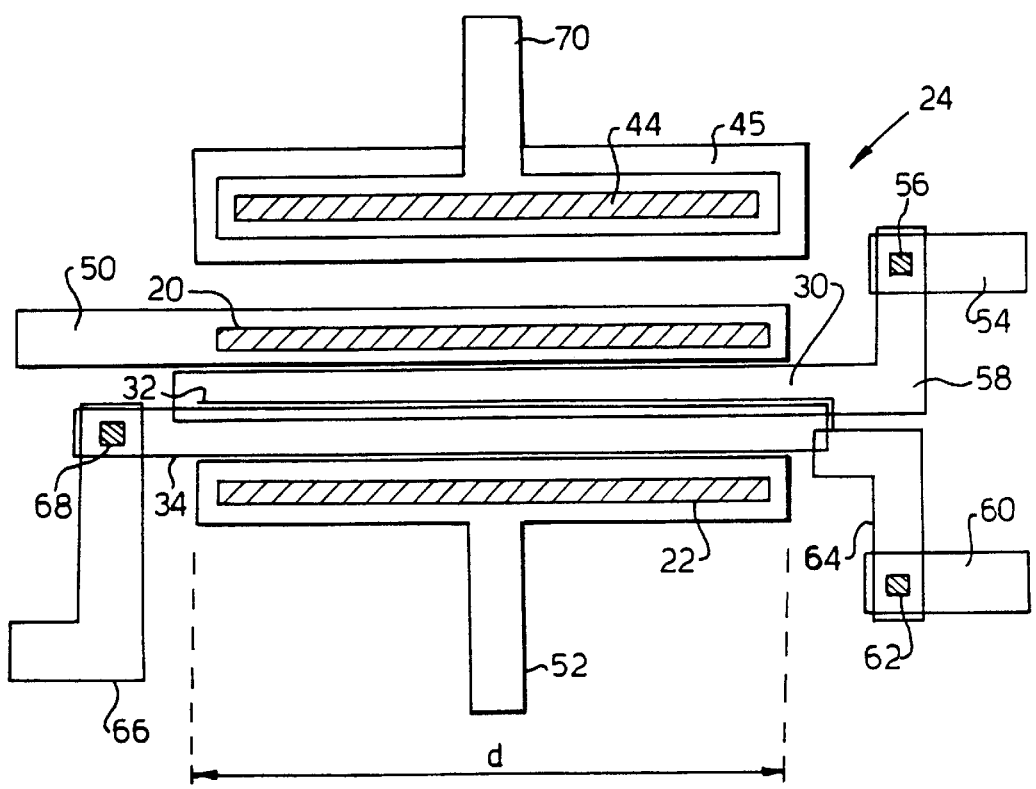
FIG. 3 is a plan-view of the FIG. 2 detector.
Figure 4A:
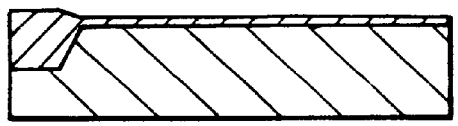
FIG. 4 shows in schematic form stages in the production of the FIG. 2 detector.
Figure 4B:
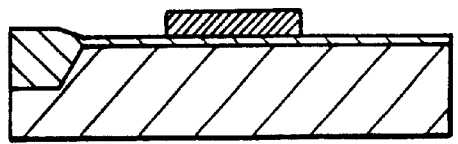
Figure 4C:
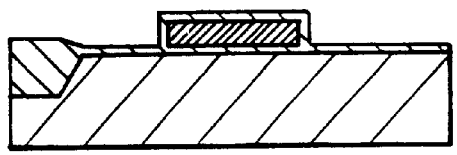
Figure 4D:
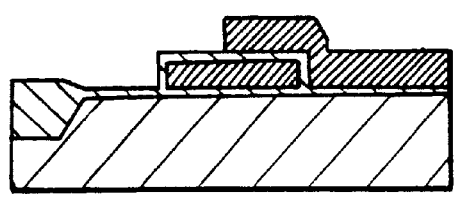
Figure 4E:
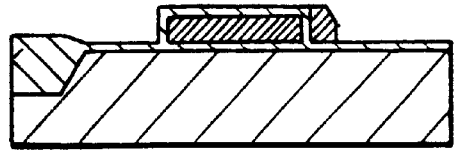
Figure 4F:
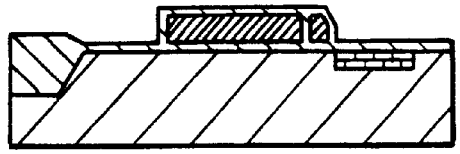
Figure 4G:
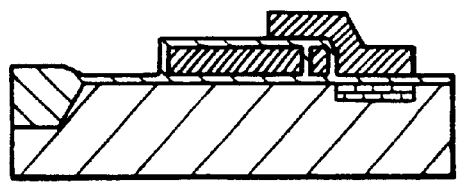

Referring now to FIG. 3, there is shown a plan view of the detector 10. In addition to the components described with reference to FIG. 2, the detector 10 has a bias connection 44 to the substrate 24 via a degenerate p-type doped contact region 45. The detector 10 has a lateral width d of approximately 25 µm.

The source contact 20 and the drain contact 22 are connected to respective one of metallised tracks 50 and 52. The detector gate 30 is connected to a metallised track 54 via a metallised contact hole 56 and an polysilicon extension 58 of the gate 30. The transfer gate 32 is connected to a metallised track 60 via a metallised contact hole 62 and a polysilicon extension 64 to the gate 32. Likewise the collector gate 34 is connected to a metallised track 66 via a metallised contact hole 68. The bias connection 44 is connected to a metallised track 70. The metallised tracks 50, 52, 54, 60, 66, and 70 lead to respective contact pads (not shown) to which electrical connection may be made by probe pins or wire bonds.

The detector 10 is fabricated as follows. A p-type Czochralski-grown {111} silicon wafer having a sheet resistivity of 30 ohm cm is ion-implanted with boron at an energy of 80 keV and a dose of $2\times10^{12}$ $cm^{-2}$. This wafer is then annealed at 1100° C. in argon—2% oxygen for 420 minutes. Any resulting oxide layer on the wafer is removed using dilute hydrofluoric acid (HF). The area of the detector 10 is then isolated from other areas on the same wafer using a LOCOS isolation process. A standard stress relief oxide layer is then grown on the surface of the silicon at a temperature of 800° C. to form an oxide layer having an approximate thickness of 40 nm. A 100 nm thick layer of silicon nitride is deposited over the whole wafer and lithographically etched to leave a pad over the area of the detector 10. A field oxide around the detector area is then grown using a wet oxidation process at 1000° C. for 120 minutes, to give an oxide thickness of approximately 550 nm. The nitride pad is then removed and any remaining oxide over the detector area is removed using dilute HF.

A gate oxide layer is then grown on the surface of the silicon in the detector area. A 40 nm layer of oxide is grown in dry oxygen at 900° C. followed by a 30 minutes anneal in argon. A polysilicon-I (first polysilicon layer) gate layer of thickness 500 nm is then deposited over the gate oxide and phosphorus doped by heating in $POCl_3$ at a temperature of 900° C. for 50 minutes. Any oxide resulting from the $POCl_3$ doping is removed using dilute HF. The polysilicon-I layer is then photolithographically patterned to give the collector gate 34. The surplus polysilicon is etched away using reactive ion etching to give a gate edge which has an angle greater than 85 degrees.

An isolation oxide layer is then grown on the polysilicon with a nominal thickness of 40 nm. A polysilicon-II gate layer is then deposited with a thickness in the range 400 to 500 nm and doped using $POCl_3$ as before followed by an oxide removal. The polysilicon-II is then etched to leave a fillet of material around the edge of the collector gate 34, forming the transfer gate 32, and the extension 64. A reactive ion etch process is used for this process. A further etch process is carried out to remove the fillet of material from certain unwanted areas, for example the left hand edge of the collector gate in FIG. 2. A 40 nm oxide layer is then grown on the remaining polysilicon II by heating at a temperature of 800° C. in wet oxygen for 60 minutes, dry oxygen for 20 minutes and finally in argon for 20 minutes. Following growth of the oxide layer, a boron ion implantation is carried out at an energy of 50 keV and a dose of $7\times10^{12}$ $cm^{-2}$. This ion implantation provides the higher dopant concentration of the detector region 38. The ion implantation to form the detector region 38 is self-aligned to the oxidised edge of the transfer gate 32. Following the ion implantation a polysilicon-III layer is deposited with a thickness of 500 nm which is then doped by heating in $POCl_3$ at 900° C. for 50 minutes, which also has the effect of annealing the detector region ion implant. The polysilicon III layer is then patterned to form the detector gate 30 using a reactive ion etch process.

The degenerate p-type doped contact region 45 is formed by ion-implanting boron through a window in a photo-resist mask at an energy of 35 keV with a dose of $2\times10^{15}$ $cm_{-2}$. The n-type prontact regions 26. and 28 are formed by ion implanting through a photo-resist window covering the whole of the active area of the detector 10 with $P^+$ ions at an energy of 80 keV with a dose of $5\times10^{15}$ $cm^{-3}$. The implantation dopes the polysilicon gates and forms the contact regions 26 and 28 by self-aligning to the left edge of the collector gate 34 and the right edge of the detector gate 30 respectively. The implantation damage is annealed at 550° C. in nitrogen for 30 minutes. A low-temperature silicon dioxide (LTO) layer is formed over the detector 10 by chemical vapour deposition to give a thickness of after densification of approximately 650 nm. The densification is achieved by annealing at 900° C. in nitrogen for 15 minutes, wet oxygen for 30 minutes and finally nitrogen for 15 minutes. The contact holes are then patterned in the LTO and these are then filled with aluminium 1% silicon. Finally, the metallised tracks of aluminium 2% silicon are formed, with a contact sinter being carried out at 425° C. in forming gas.

The fabrication sequence is shown schematically in FIG. 4. FIG. 4a shows the detector after the LOCOS device isolation stage and gate oxidation. FIG. 4b shows the device after the deposition and patterning of the collector gate. The collector gate has been oxidised in FIG. 4c. In FIG. 4d, the polysilicon-II layer has been deposited. FIG. 4e shows the device after the polysilicon II layer has been anisotropically etched to form the fillet and after partial removal of the fillet. In FIG. 4f, the remaining polysilicon fillet has been oxidised and the self-aligned ion implantation to from the detector region has been performed. finally, FIG. 4g shows the device after the detector gate has been patterned from the polysilicon-III layer.

This fabrication process was developed to accommodate a standard fabrication facility which has a 2.0 μm feature size. It will be appreciated that other fabrication processes may be devised for fabrication facilities which have sub-micrometre feature sizes, with the patterning of the transfer gate with a sub-micrometre width being potentially simplified. Ideally, the gate oxide underneath the detector gate 30 should be less than that under the collector gate 34. However, in order to perform the self-aligned ion implantation to form the detector region 38, the collector gate and the transfer gate 32 have to be deposited first which leads to the gate oxide being thicker under the detector gate than the transfer gate. In an alternative fabrication sequence, it might be possible to thin the gate oxide underneath the detector gate prior to the deposition of the polysilicon III layer.

In order to provide the necessary inter-sub-band energy level spacing, the dopant ensity under the detector gate should lie in the range $3\times10^{17}$ cm$^{-3}$ to $1\times10^{18}$ cm$^{-3}$. The detector doping level could be adjusted to change the inter-subband spacing which would determine the long wavelength cut-off of the detector. The above dopant range is appropriate for detection in the 8 μm to 14 μm band. The doping under the transfer gate should be less than that under the detector gate but must be high enough to minimise "punch-through" from the collector.

Figure 5:
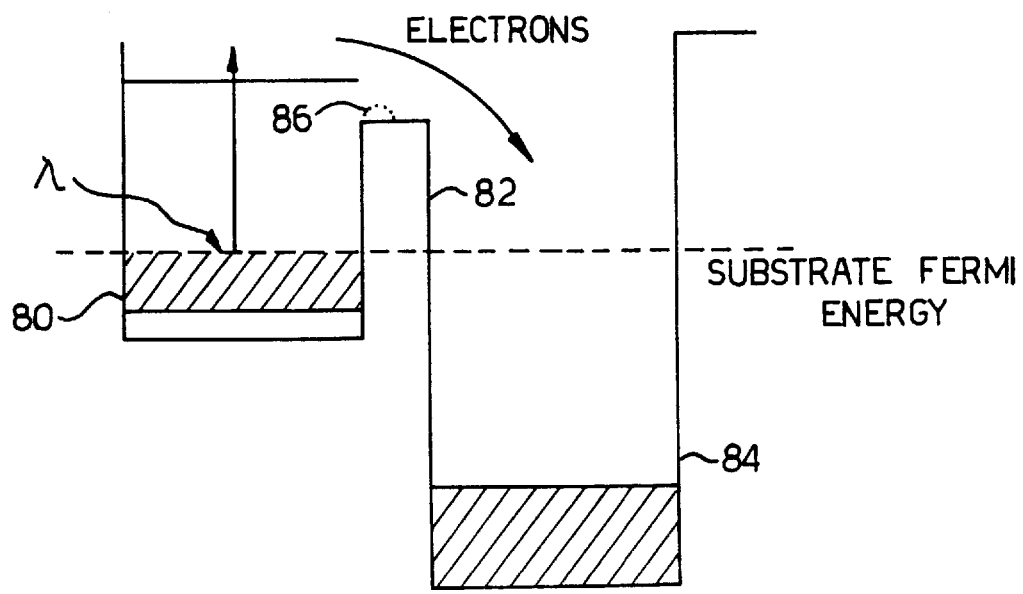
FIG. 5 is a schematic energy level diagram of the FIG. 2 device in a biased state.

Referring now to FIG. 5, there is shown a schematic band structure of the detector 10 after the gates have been biased. A detector well 80 is heavily doped with a dopant concentration greater than $10^{17}$ cm$^{-3}$. A potential applied to the transfer gate produced a potential barrier 82 of approximately 100 meV, corresponding to the energy separation of the quantised sub-bands. A storage well 84 has low doping to provide enhanced storage capacity. Photo-excited electrons have sufficient energy to cross the barrier 82 and be collected in the storage well for readout in a process similar to that used for charge-coupled device systems. Measurements from test devices were however obtained by passing a constant current from the source 22 of the detector to the drain 24. The voltage across the channel is amplified before being fed into a Fourier transform infra-red spectrometer as an external detector signal.

It is estimated, using as a basis a scientific paper of T.Ando in Z. Physik B, Volume 26, 1977, page 263, that for a doping level of $5\times10^{17}$ cm$^{-3}$ and an energy spacing of 100 meV, a surface charge density of $1.2\times10^{13}$ cm$^{-2}$ is required. For a 29 nm thick gate oxide, this corresponds to a detector gate voltage of 16 V.

For a lateral transfer device, the barrier for lateral electron flow should be lower, or non-existent, in the excited state than in the ground state. This is achieved by having a higher transverse electric field under the detector gate than the transfer gate by using a higher doping and a gate voltage. Electrons excited into the upper state will diffuse into the transfer region before inter-sub-band scattering to the ground state. Once in the transfer region, electrons are free to diffuse back into the detector well, and the diffusion current will be inversely proportional to the transfer gate length. It is estimated that the excited state lifetime may be approximately 1 ps, which would give a value of approximately 30 nm for the excited state diffusion length. It would thus be expected that electrons excited into the upper state will diffuse into the transfer region if they are within approximately 30 nm of it. If there is a transition region between the detector well and the top of the transfer barrier, it should be less than 30 nm wide. The main energy loss mechanism for excited carriers is optical phonon emission. The optical phonon energy in silicon is 63 meV and hence this energy loss mechanism is not possible through most of the transition region, and so it is possible that the transition region could be significantly longer than the excited carrier diffusion length without degrading performance.

A diffusion barrier in the ground state to stop electrons falling back into the detector well would allow a longer transfer gate to be used, which would manifest itself in FIG. 5 as a small barrier on the left hand side of the ground state of the transfer region shown by a dotted line 86.

It is estimated that the total power absorbed from a black body at 300 K for f/1 optics equates to $2.0\times10^{14}$ electrons s$^{-1}$ cm$^{-2}$, and thus for a frame time of 1/25 s, a total of $8\times10^{12}$ electrons cm$^{-2}$ would be available for detection. Inherent transfer inefficiencies would reduce this figure by perhaps three orders of magnitude. The operation temperature for the detector 10 is determined by the temperature at which the thermal generation rate of electrons into the upper subband falls below the optical excitation rate, and the detector becomes background limited, a temperature referred to as $T_{BLIP}$. The temperature $T_{BLIP}$ is obtained from the equation:

$$R_{opt} = \frac{n_1}{\tau} = \frac{n_0}{\tau}\exp\left(-\frac{E_{01}}{k_B T_{BLIP}}\right),$$

where $n_0$ and $n_1$ are the thermal equilibrium occupancies of the first and second sub-bands, $E_{01}$ is the sub-band spacing and $\tau$ is the excited state lifetime. $R_{opt}$ is the optical excitation rate, estimated to be $2.0\times10^{14}$ electrons s$^{-1}$ cm$^{-2}$, giving a $T_{BLIP}$ of approximately 48 K.

Aerial concentrators may be employed to increase the absorption efficiency. Aerial concentrators are described in U.S. Pat. No. 5,248,884. In such a device, square metallic aerials on the surface of the detector would be arranged to concentrate the electric field of incident radiation in the region of the detector well/transfer gate interface, thereby enhancing quantum efficiency and so raising the operating temperature.

The detector 10 is arranged to detect infra-red radiation which is normally incident. For {111} silicon surfaces inter-sub-band transitions are possible with the electron motion parallel to the surface. For {100} silicon surfaces, the quantised electron motion is perpendicular to the surface and hence the electric field of the incident radiation should also be perpendicular to the surface. For detectors similar to the detector 10 but fabricated on {100} silicon, it would be necessary to illuminate the detector through a prism or by adding a diffraction grating on the surface of the detector to provide a component of the electric field of the incident radiation perpendicular to the surface.

Figure 6:
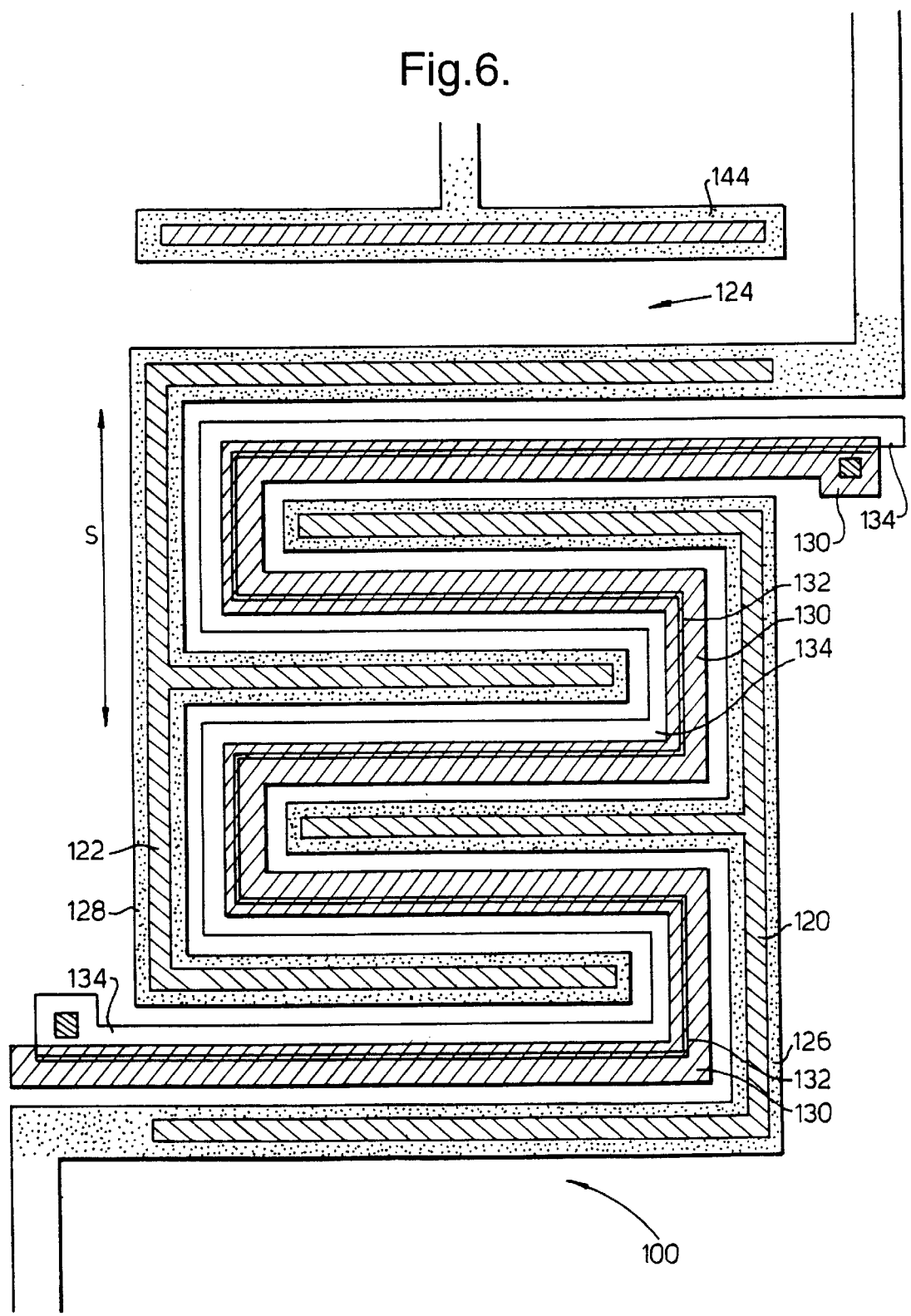
FIG. 6 is a plan view of an interdigitated detector of the invention.

Referring now to FIG. 6 there is shown a plan view of an interdigitated detector of the invention, indicated generally by 100. The detector has a source contact 12.0 and a drain contact 122 connected to respective contact regions 126 and 128 which have n-type degenerate doping. Between the source and the drain is a detector gate 130 which overlies a transfer gate 132 and partially overlies a collector gate 134. In addition, the detector 100 has a bias connection 144 to a substrate 124. The functional roles of the components of the detector 100 are equivalent to those of the detector 10 of FIG. 2, with the components of the detector 100 being equivalent to those of the detector 10 prefixed by a 1.

The detector 100 is suitable for incorporation in an array of similar detectors, with each detector forming the detector element for one pixel. The detector 100 is interdigitated with a pitch, S, of 8 µm, thereby increasing the area per pixel of silicon available from which excited electrons may be detected. If only excitations within a diffusion length of the transfer gate are detected, the collection efficiency is equal to [(30 nm×2)/8 µm]=0.8%. From an analysis of the probable transfer efficiency for transfer gate barriers of differing height, it is expected that the transfer efficiency is approximately 50%. In each pixel, it is necessary to have storage capacitors to store the charge from the photocurrent and read-out transistors. For a 50 µm size pixel it is estimated that these components would occupy approximately 35% of the available area, giving a fill factor of approximately 65%. The overall efficiency would therefore be approximately 0.0025%. Combining this number with the number of electrons excited per frame time per unit area, and the size of the pixel gives the total number of stored electrons in one frame time, N, equal to approximately $4.9 \times 10^5$.

The noise equivalent temperature difference, NETD, is given by:

$$NETD = \frac{1}{c\sqrt{N}} \sqrt{\frac{N_{total}}{N}},$$

where the contrast, c, is the fractional change in flux with temperature given by:

$$c = \frac{1}{\Phi} \frac{\partial \Phi}{\partial T} \approx \frac{1}{74\ K}$$

at this wavelength, and $N_{total}$ includes thermally generated carriers. This gives an NETD of 106 mK at a temperature where $\sqrt{N/N_{total}}=0.992$. For a doubled quantum efficiency, achievable for example by having an anti-reflection top coating and a mirrored rear and 0.3 µm design rules, an NETD of 41 mK may be obtainable. To reduce the NETD to 20 mK, similar to hybrid cadmium mercury telluride/silicon detectors operating at 77 K, would require a five-fold increase in efficiency. This increase might be achievable if aerial concentrators were to be located above the transfer gate. Efficiency might also be increased if electron-beam lithography were to be used, reducing the feature size to 0.1 µm. Optical immersion using microlenses may also provide a route to increasing efficiency.

The detectors 10 and 100 each incorporated a polysilicon transfer gate. Alternative configurations for the detectors might provide the desired barrier structure. It might be possible to alter the thickness of the gate oxide rather than have a separate transfer gate. Such a device could improve the fill factor but would reduce the tunablity compared with the detectors 10 and 100.

Figure 7:
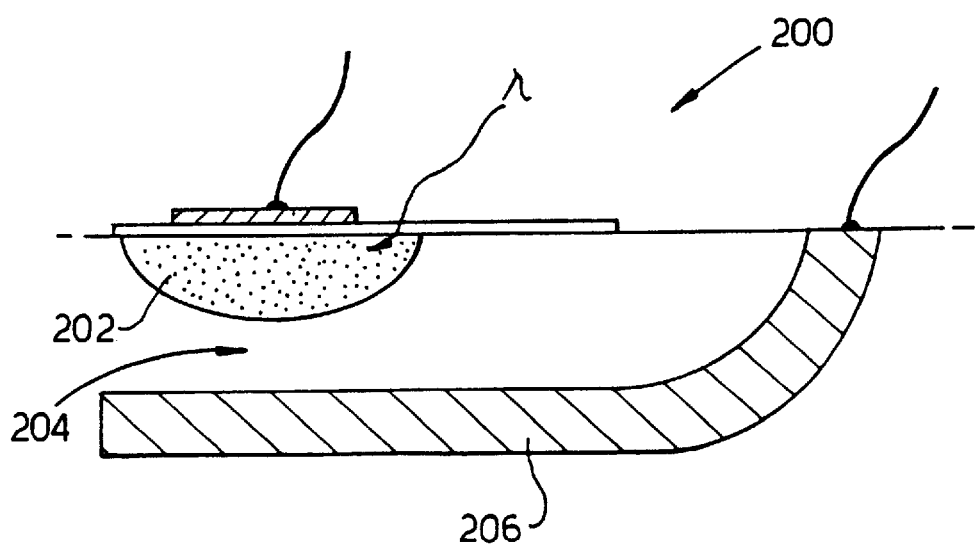
FIG. 7 is a cross-sectional view of a vertical transfer detector of the invention.

A further possible configuration is shown in FIG. 7. FIG. 7 shows a cross-section of a vertical read-out detector 200. Photoexcited electrons from a detector region 202 of lightly doped p-type silicon are ejected over a barrier formed by a thin moderately highly doped p-type layer 204 to a collector region 206 which is heavily doped n-type from where the charge could be read out. By applying a bias to the buried collector relative to the detector region 202, the p-type layer 204 could be fully depleted and increasing the bias further would reduce the height of the barrier until it disappears and current flows directly from the detector region to the buried collector region. The height of the barrier is dependent on the uniformity of the doping and the thickness of the layer 204 and so in practise for an array of detectors 200, a biasing scheme specific to each pixel would have to be adopted, since a common biasing voltage would lead to differences in barrier height across the array.

The detector 200 might be fabricated by degenerately doping a surface region of a p-type silicon wafer n-type and then growing an epitaxial layer of silicon over the n-type region to form the layer 204. The detector region would then be formed by ion-implantation and a detector gate and source and drain contacts fabricated in a manner similar to those of the detector 10.

What is claimed is:

1. An infra-red detector for detecting photons of infrared radiation having a wavelength within an operating band, said detector comprising a doped semiconductor substrate, said substrate comprising:

a detector region having a dopant concentration and a plurality of sub-band energy levels;

a collector region having a dopant concentration; and a barrier region having a dopant concentration less than said detector region dopant concentration, said detector region, barrier region and collector region are laterally displaced with respect to one another over a surface region of said semiconductor substrate, said barrier region located between said detector region and said collector region, wherein said incident infra-red radiation of a wavelength within said operating band excites electrons within the detector region to an excited state in which the electrons have an energy corresponding to said sub-band energy levels such that said electrons cross the barrier region and are detectable in the collector region.

2. A detector according to claim 1 wherein the detector incorporates a detector gate, a transfer gate and a collector gate, wherein application of a respective electrical potential to each of the gates controls the operation of the detector.

3. A detector according to claim 1 wherein the detector is disposed on a silicon substrate.

4. A detector according to claim 3 wherein the silicon substrate has a surface having a {111} crystallographic orientation.

5. A detector according to claim 3 wherein the detector region has a dopant concentration in the range $3 \times 10^{17}$ cm$^{-3}$ to $1 \times 10^{18}$ cm$^{-3}$.

6. A detector according to claim 1 wherein the detector incorporates a detector gate and a collector gate and application of a respective electrical potential to each of the gates controls the operation of the detector.

7. A detector according to 1 wherein the regions are interdigitated.

* * * * *